(12) United States Patent
Beintner et al.

(10) Patent No.: US 6,998,666 B2
(45) Date of Patent: Feb. 14, 2006

(54) NITRIDED STI LINER OXIDE FOR REDUCED CORNER DEVICE IMPACT ON VERTICAL DEVICE PERFORMANCE

(75) Inventors: Jochen Beintner, Wappingers Falls, NY (US); Rama Divakaruni, Ossining, NY (US); Rajarao Jammy, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/707,754

(22) Filed: Jan. 9, 2004

(65) Prior Publication Data

US 2005/0151181 A1 Jul. 14, 2005

(51) Int. Cl.
*H01L 21/8242* (2006.01)

(52) U.S. Cl. ............ 257/301; 257/302; 257/303; 257/304; 257/305; 257/296; 257/299; 257/300; 438/242; 438/243; 438/244; 438/245

(58) Field of Classification Search ............ 257/301, 257/302, 303, 510, 639, 642, 397, 437, 296, 257/299, 300, 305, 304; 438/242–245
See application file for complete search history.

(56) References Cited

U.S. PATENT DOCUMENTS

| | | | |
|---|---|---|---|
| 6,046,487 A * | 4/2000 | Benedict et al. ............ 257/510 |
| 6,100,143 A | 8/2000 | Brown et al. | |
| 6,121,064 A | 9/2000 | Lasky et al. | |
| 6,140,208 A | 10/2000 | Agahi et al. | |
| 6,284,593 B1 * | 9/2001 | Mandelman et al. ....... 438/248 |
| 6,406,962 B1 | 6/2002 | Agnello et al. | |
| 6,414,347 B1 | 7/2002 | Divakaruni et al. | |
| 6,440,872 B1 * | 8/2002 | Mandelman et al. ....... 438/745 |
| 2002/0085434 A1 * | 7/2002 | Mandelman et al. ....... 365/200 |

* cited by examiner

*Primary Examiner*—Nathan J. Flynn
*Assistant Examiner*—Fazli Erdem
(74) *Attorney, Agent, or Firm*—DeLio & Peterson, LLC; Peter W. Peterson; Todd M. C. Li

(57) ABSTRACT

A method of fabricating an integrated circuit device comprises etching a trench in a substrate and forming a dynamic random access memory (DRAM) cell having a storage capacitor at a lower end and an overlying vertical metal oxide semiconductor field effect transistor (MOSFET) comprising a gate conductor and a boron-doped channel. The method includes forming trenches adjacent the DRAM cell and a silicon-oxy-nitride isolation liner on either side of the DRAM cell, adjacent the gate conductor. Isolation regions are then formed in the trenches on either side of the DRAM cell. Thereafter, the DRAM cell, including the boron-containing channel region adjacent the gate conductor, is subjected to elevated temperatures by thermal processing, for example, forming a support device on the substrate adjacent the isolation regions. The nitride-containing isolation liner reduces segregation of the boron in the channel region, as compared to an essentially nitrogen-free oxide-containing isolation liner.

14 Claims, 3 Drawing Sheets

NITRIDED STI LINER OXIDE FOR REDUCED CORNER DEVICE IMPACT ON VERTICAL DEVICE PERFORMANCE

BACKGROUND OF INVENTION

The present invention relates to semiconductor processing, and in particular to the fabrication of an integrated circuits having both a vertical dynamic random access memory (DRAM) and other support circuits, and including an isolation trench that reduces corner device effects in the DRAM.

Vertical dynamic random access memory (DRAM) circuits have been employed to reduce effective cell size and increase memory density. Typically, a vertical DRAM memory cell comprises a vertical metal oxide semiconductor field effect transistor (MOSFET) connected to a trench capacitor below the MOSFET. In the vertical MOSFET, a surface of the channel region of the transistor is generally perpendicular to the primary surface of the substrate.

DRAM circuits may be made by separating the process steps for the vertical arrays and planar support devices, e.g. logic circuits. However, significant challenges exist in the manufacture of combined DRAM circuits where the fabrication of embedded vertical DRAMs is integrated into the process flow of the fabrication of planar support devices. Among these problems is the increased thermal budget, i.e., the cumulative effect of time at elevated temperature to which the implants for the vertical device are exposed. Thermal processing is typically involved in growing oxide layers such as the DRAM gate sidewall layers and the planar gate oxide in the support area, and may reach temperatures of 1000–1200° C. When implants for the vertical device are made before such extensive thermal processing, segregation often results. For example, shallow trench isolation (STI) with an oxide liner may be employed to isolate the DRAMs. In such case, the corner device of the transistor portion of the DRAM may be affected by the STI liner oxidation because of boron segregation into the liner, and resulting depletion in the channel adjacent the gate conductor, as a result of exposure to higher temperatures.

Accordingly, there is a need for a structure which reduces unwanted corner device effect of a vertical DRAM, particularly from boron depletion in areas adjacent the gate and STI.

SUMMARY OF INVENTION

Bearing in mind the problems and deficiencies of the prior art, it is therefore an object of the present invention to provide a structure for a vertical DRAM which permits successful integration into the process flow with planar devices.

It is another object of the present invention to provide an integrated method of manufacturing of vertical DRAMs with planar support devices, which reduces corner effects in the transistor portion of the DRAM.

A further object of the present invention is to provide a structure and method for manufacturing vertical DRAMs that resist segregation of dopants into adjacent isolation trenches during subsequent thermal processing.

Still other objects and advantages of the invention will in part be obvious and will in part be apparent from the specification.

The above and other objects and advantages, which will be apparent to one of skill in the art, are achieved in the present invention which, in a first aspect, is directed to an integrated circuit device comprising a dynamic random access memory (DRAM) cell having a storage capacitor formed within a deep trench in a substrate and a gate conductor overlying the storage capacitor within the deep trench, and isolation regions on either side of the DRAM cell, the isolation regions extending below the gate conductor. The device also includes a liner comprising a nitride compound adjacent the isolation regions and extending at least between each of the isolation regions and the gate conductor.

Preferably, the liner comprises a silicon-oxy-nitride compound, and extends alongside and below the isolation regions. The storage capacitor of the DRAM cell may extend below the isolation regions and liner.

The region adjacent the gate conductor typically contains a dopant, such as boron, and the integrated circuit device further includes an oxide layer between the gate conductor and the dopant-containing region, and extending between the isolation regions. The oxide layer and isolation regions define corner regions of the gate conductor and dopant-containing region, such that the liner reduces dopant depletion in the corner regions during subsequent thermal processing of the DRAM cell.

Typically, a vertical metal oxide semiconductor field effect transistor (MOSFET) comprising the gate conductor and a boron-doped channel overlies the storage capacitor. The integrated circuit device may further include a planar support device adjacent the DRAM cell, the planar support device including a thermally produced oxidation layer.

In another aspect, the present invention is directed to a method of fabricating an integrated circuit device comprising providing a substrate, etching a trench in the substrate and forming in the trench a dynamic random access memory (DRAM) cell. The DRAM cell has a storage capacitor at a lower end of the trench and a gate conductor overlying the storage capacitor within the trench. The method then includes doping regions in the substrate adjacent the gate conductor, and forming trenches adjacent the DRAM cell, wherein the trenches extending below the gate conductor. In the trenches there is formed an isolation liner, comprising a nitride compound, on either side of the DRAM cell, adjacent the gate conductor. The method also includes forming isolation regions in the trenches on either side of the DRAM cell. Thereafter, the DRAM cell, including the dopant-containing region adjacent the gate conductor, is subjected to elevated temperatures by thermal processing, for example, forming a support device on the substrate adjacent the isolation regions. The nitride-containing isolation liner reduces segregation of the dopant in the region adjacent to the gate conductor as a result of the thermal processing, as compared to an essentially nitrogen-free oxide-containing isolation liner. The dopant is preferably boron, and the liner preferably comprises a silicon-oxy-nitride compound.

The regions in the substrate adjacent the gate conductor typically comprise channels of a vertical MOSFET. Preferably, the liner is formed on walls of the trenches on either side of the DRAM cell, such that the liner extends alongside and below the isolation regions. The storage capacitor of the DRAM cell may extend below the isolation regions and liner.

The method may further include forming an oxide layer between the gate conductor and the dopant-containing region, and extending between the isolation regions. The oxide layer and isolation regions define corner regions of the gate conductor and dopant-containing region, and the liner reduces dopant depletion in the corner regions during subsequent thermal processing.

In a further aspect, the present invention is directed to an integrated circuit device and method for making an integrated circuit device comprising a silicon substrate having active regions, with a DRAM cell formed within a deep trench between the active regions in the substrate. The DRAM cell includes a polysilicon gate conductor. The integrated circuit device further includes an oxidized and nitrided sidewall layer formed and extending continuously along the silicon substrate active regions and the polysilicon gate conductor. Preferably, the DRAM cell comprises a vertical MOSFET having the gate conductor and including a gate oxide layer between the gate conductor and at least one of the active regions in the substrate. The integrated circuit device further includes a pair of the oxidized and nitrided sidewall layers as liners for isolation regions formed on either side of the DRAM cell and active regions in the substrate.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

Figure 1:
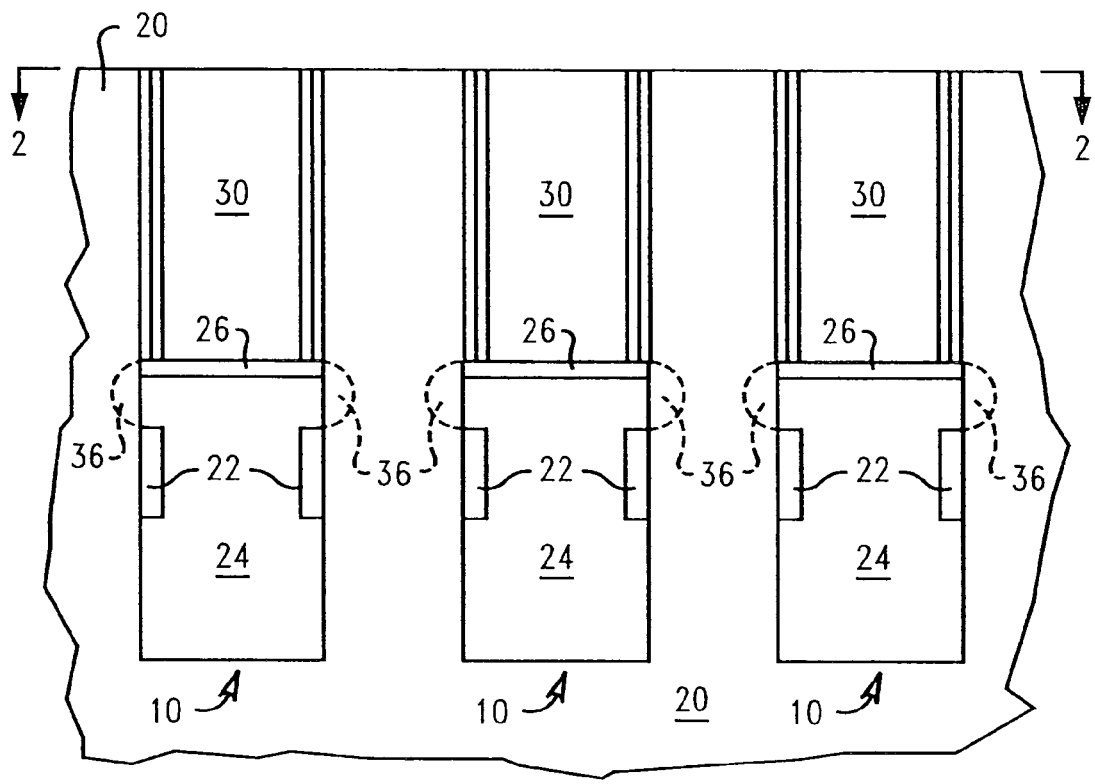
FIG. 1 is a cross-sectional elevational view of an array of vertical DRAM cells.

In describing the preferred embodiment of the present invention, reference will be made herein to FIGS. 1–5 of the drawings in which like numerals refer to like features of the invention. Features of the invention are not necessarily shown to scale in the drawings.

Figure 2:
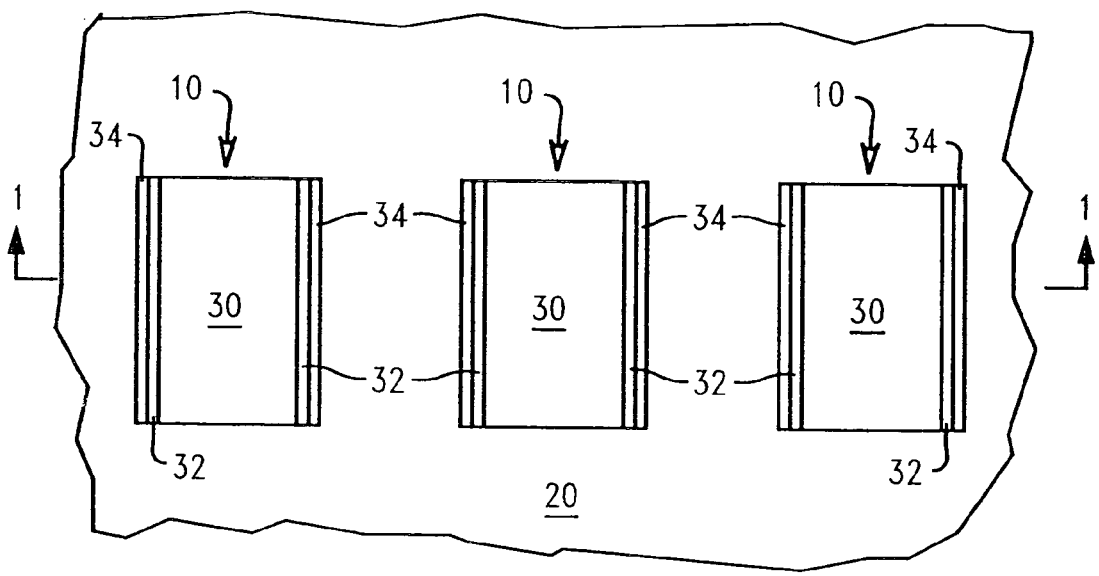
FIG. 2 is a top plan view of the array of vertical DRAM cells of FIG. 1.

In accordance with the invention, an array of vertical DRAMs 10 are shown in elevational cross-sectional view in FIG. 1 and in plan view in FIG. 2. Each vertical DRAM 10 contains a vertical MOSFET formed in a semiconductor wafer substrate 20, preferably a silicon substrate, over a trench capacitor. In the fabrication process, a plurality of vertical deep trenches are formed from a top surface down into the silicon substrate 10 by known patterning and etching techniques. Using known processing techniques, the bottom portion of each vertical trench is then provided with a trench collar 22 of oxide surrounding a portion of doped polysilicon fill 24. The polysilicon fill 24 is completely covered with a trench top oxide (TTO) layer 26 so as to form a trench storage capacitor 24 within the lower portion of each trench, which acts as the storage node. As shown in the drawings, trench storage capacitor 24 extends deep into the substrate 10. Oxide collar 22 extends downward near the bottom portion of the trench and upward near TTO 26. Strap diffusion regions 36 are formed into the silicon substrate adjacent the trench to form an electrical bridge with the storage capacitors 24.

Above each capacitor 24, a vertical transistor is formed within the vertical trench. This is accomplished by first depositing channels 34 along the sidewalls of the trenches, which are typically doped with boron, and then growing gate oxide layers 32 thereover by thermal processing. Subsequently, there is deposited polysilicon within the remaining upper portion of each trench to form vertical gate conductors 30 above the trench top oxide layer 26. The trench top oxide layer 26 insulates the gate conductor 30 in the upper portion of the trenches from the storage node in the lower portion of the trenches in the DRAM arrays 10.

Figure 3:
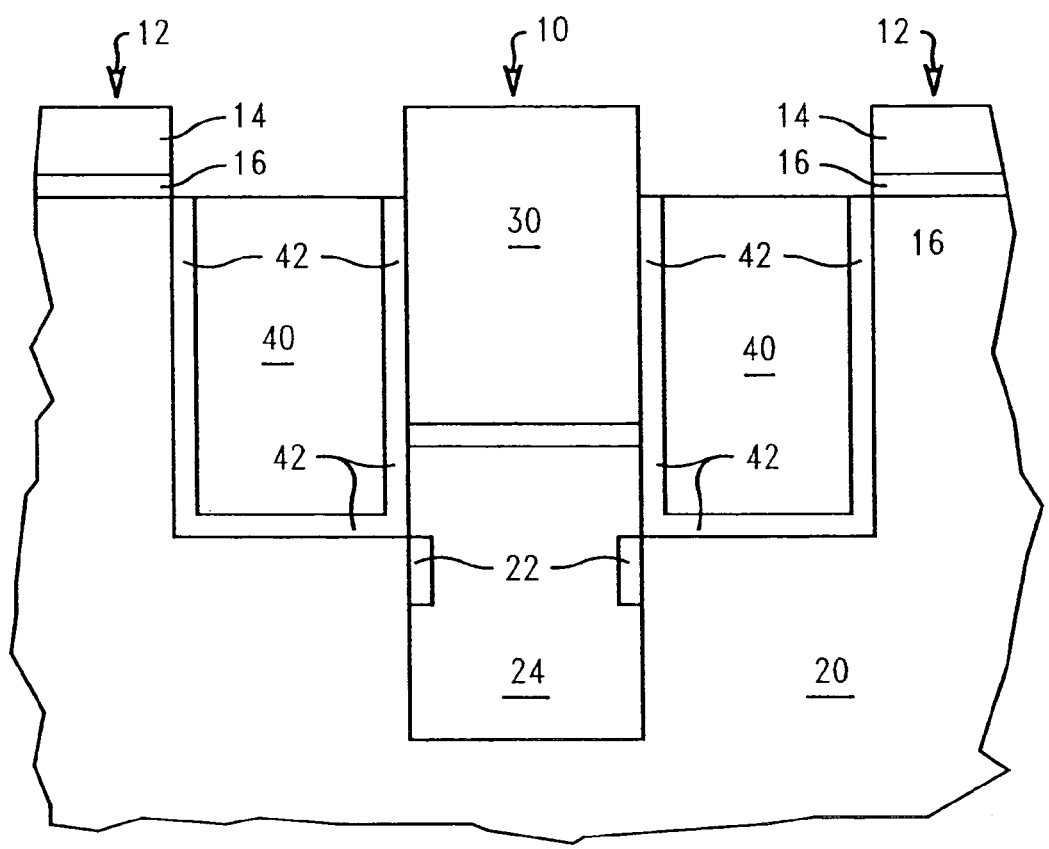
FIG. 3 is a cross-sectional elevational view of STIs formed alongside the array of vertical DRAM cells of FIG. 1.
Figure 4:
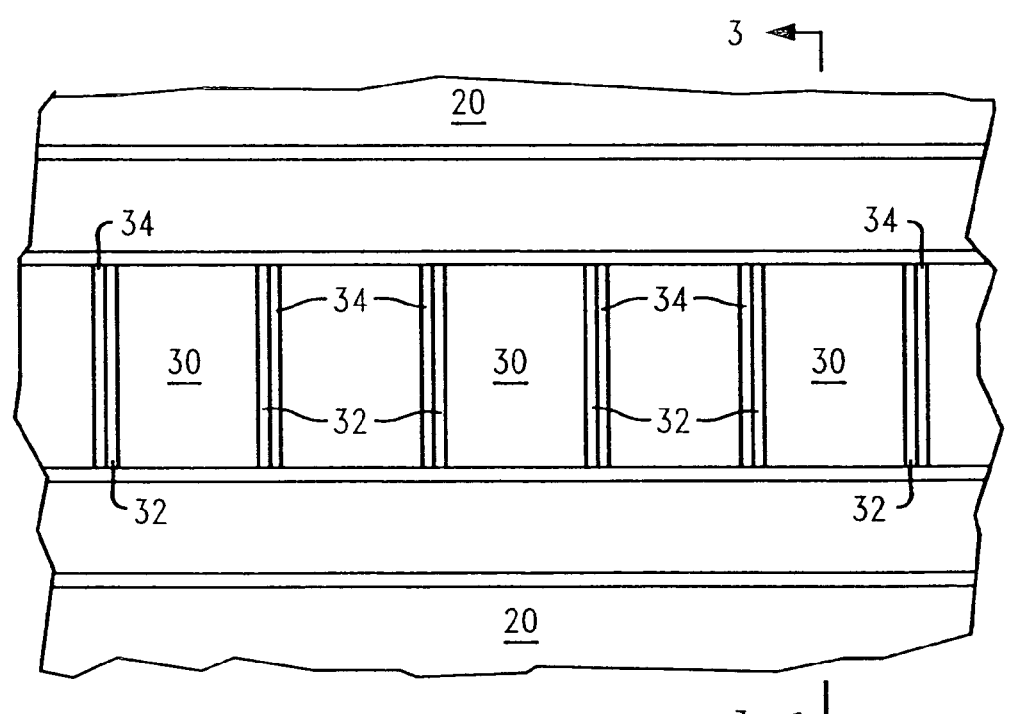
FIG. 4 is a top plan view of the STIs and array of vertical DRAM cells of FIG. 3.

As shown in FIGS. 3 and 4, shallow trench isolations (STIs) 40 are then formed in the silicon substrate 20 alongside the array of DRAMs 10. Trenches are first formed by known techniques to extend downward below TTO 26, and to the upper portion of collar 22. These trenches are then lined by forming a nitride compound, preferably a silicon-oxy-nitride formed by methods known in the art such as nitridation (for example, plasma or furnace) post-oxidation or oxidation in a nitrogen ambient gas, such as NO, $N_2O$, $NH_3$ and the like. Thus, the continuous sidewall extending along each of the gate conductors 30 and the active silicon substrate 20 areas between the gate conductors is preferably both oxidized and nitrided. The sides and bottom of the trenches are preferably fully lined with the nitride liner, except for the portions near the top.

STIs 40 isolate DRAM array area 10 from planar support areas 12 of the substrate, as depicted in FIG. 3. The support areas, formed on substrate 20 may include logic devices employing a gate layer 14 over a gate oxide layer 16. This processing of the planar support devices subsequent to the formation of the DRAM transistor typically employs high temperatures, often in the range up to 1000–1200° C., to form sacrificial oxidation layers and to heat treat the layers and components.

Figure 5:
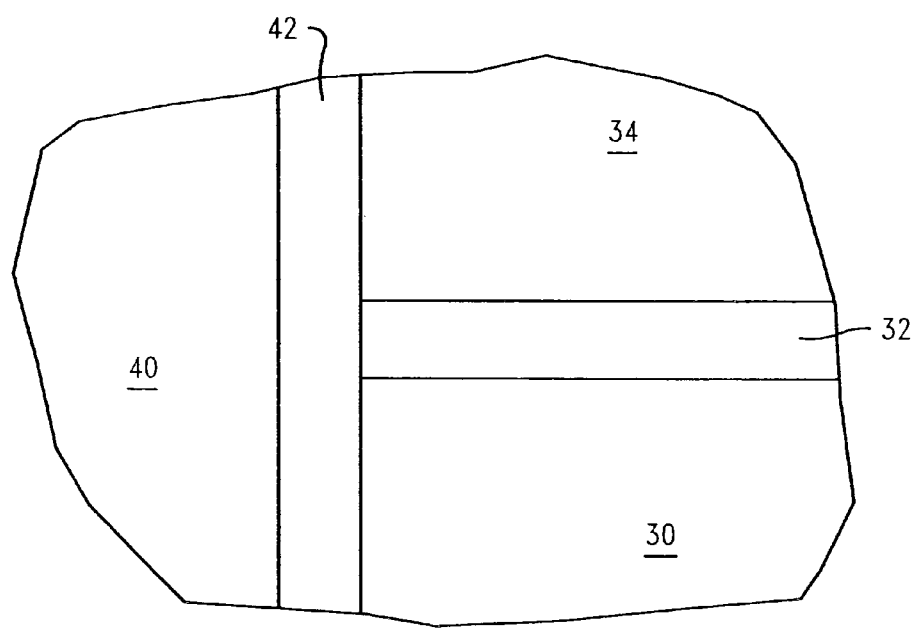
FIG. 5 is a close up of a portion of FIG. 4 showing the corner region of the gate and channel adjacent the STI liner and vertical gate oxide layer.

The corner device of a cell of DRAM 10 is shown in more detail in FIG. 5. Channel 34 is typically doped with a p-type dopant such as boron. The channel 34 region adjacent the gate conductor 30 near the corner formed by the gate oxide layer 32 and STI liner 42 typically has different characteristics than regions away from the corner. It has been unexpectedly found that, by use of the nitride liner 42 for the isolation region 40, there is significantly reduced segregation of boron as a result of thermal processing of the various oxide layers and other heat treatments. The use of the nitride layer has been found to result in less diffusion of the boron into the STI liner 42, as compared to diffusion into prior art STI liner oxides, which are essentially nitrogen-free. Surface boron concentration between the liner and the active silicon between the vertical MOSFETs has been found to differ by a minimum of 1 $E^{15}$ atoms/$cm^3$.

Accordingly, the present invention provides a structure for a vertical DRAM which permits successful integration into the process flow with planar devices when the DRAM is subjected to significant thermal effects. In particular, the integrated method of manufacturing of the present invention reduces corner effects in the transistor portion of the DRAM.

While the invention has been described herein in accordance with certain preferred embodiments thereof, those skilled in the art will recognize the many modifications and enhancements which can be made without departing from the true scope and spirit of the present invention, limited only by the claims appended below.

What is claimed is:

1. An integrated circuit device comprising:
a dynamic random access memory (DRAM) cell having a storage capacitor formed within a deep trench in a substrate, the storage capacitor having an oxide trench collar, a gate conductor overlying said storage capacitor within said deep trench and a strap diffusion region adjacent the storage capacitor between the oxide trench collar and the gate conductor;
isolation regions on either side of the DRAM cell, the isolation regions extending below the gate conductor; and
a liner comprising a nitride compound adjacent the isolation regions and extending at least between each of the isolation regions and the gate conductor and to the oxide trench collar below the strap diffusion region.

2. The integrated circuit device of claim 1 wherein the liner comprises a silicon-oxy-nitride compound.

3. The integrated circuit device of claim 1 wherein the liner extends alongside and below the isolation regions.

4. An integrated circuit device comprising:
a dynamic random access memory (DRAM) cell having a storage capacitor formed within a deep french in a substrate and a gate conductor overlying said storage capacitor within said deep trench, a region adjacent the gate conductor containing a dopant;
isolation regions on either side of the DRAM cell, the isolation regions extending below the gate conductor;
a liner comprising a nitride compound adjacent the isolation regions and extending at least between each of the isolation regions and the gate conductor; and
an oxide layer between the gate conductor and the dopant-containing region, and extending between the isolation regions,
wherein the oxide layer and isolation regions define corner regions of the gate conductor and dopant-containing region, and wherein the liner reduces dopant depletion in the corner regions during subsequent thermal processing of the DRAM cell.

5. The integrated circuit device of claim 4 wherein the dopant-containing region adjacent the gate conductor comprises a channel.

6. The integrated circuit device of claim 4 wherein the dopant comprises boron.

7. An integrated circuit device comprising:
a dynamic random access memory (DRAM) cell having a storage capacitor formed within a deep trench in a substrate and a gate conductor overlying said storage capacitor within said deep trench;
isolation regions on either side of the DRAM cell, the isolation regions extending below the gate conductor;
a liner comprising a nitride compound adjacent the isolation regions and extending at least between each of the isolation regions and the gate conductor; and
a planar support device adjacent the DRAM cell, the planar support device including a thermally produced oxidation layer.

8. The integrated circuit device of claim 1 wherein the storage capacitor of the DRAM cell extends below the isolation regions and liner.

9. The integrated circuit device of claim 1 wherein a vertical metal oxide semiconductor field effect transistor (MOSFET) comprising the gate conductor and a boron-doped channel overlies the storage capacitor.

10. An integrated circuit device comprising:
a dynamic random access memory (DRAM) cell having a storage capacitor formed within a deep trench in a silicon substrate and a gate conductor overlying said storage capacitor within said deep trench, a region adjacent the gate conductor containing a boron dopant;
isolation regions on either side of the DRAM cell, the isolation regions extending below the gate conductor;
a liner comprising a silicon-oxy-nitride compound adjacent the isolation regions and extending at least between each of the isolation regions and the gate conductor; and
an oxide layer between the gate conductor and the boron dopant-containing region, and extending between the isolation regions, wherein the oxide layer and isolation regions define corner regions of the gate conductor and boron dopant-containing region, and
wherein the liner reduces boron depletion in the corner regions during subsequent thermal processing of the DRAM cell.

11. The integrated circuit device of claim 10 wherein the liner extends alongside and below the isolation regions.

12. The integrated circuit device of claim 10 wherein the boron dopant-containing region adjacent the gate conductor comprises a channel, and wherein a vertical metal oxide semiconductor field effect transistor (MOSFET) comprising the gate conductor and the boron-doped channel overlies the storage capacitor.

13. The integrated circuit device of claim 10 further including a planar support device adjacent the DRAM cell, the planar support device including a thermally produced oxidation layer.

14. The integrated circuit device of claim 10 wherein the storage capacitor of the DRAM cell extends below the isolation regions and liner.

* * * * *